United States Patent
Wieting

(10) Patent No.: US 8,082,672 B2
(45) Date of Patent: Dec. 27, 2011

(54) MECHANICAL PATTERNING OF THIN FILM PHOTOVOLTAIC MATERIALS AND STRUCTURE

(75) Inventor: Robert D. Wieting, San Jose, CA (US)

(73) Assignee: Stion Corporation, San Jose, CA (US)

(*) Notice: Subject to any disclaimer, the term of this patent is extended or adjusted under 35 U.S.C. 154(b) by 0 days.

(21) Appl. No.: 12/577,133

(22) Filed: Oct. 9, 2009

(65) Prior Publication Data

US 2011/0020977 A1    Jan. 27, 2011

Related U.S. Application Data

(60) Provisional application No. 61/106,506, filed on Oct. 17, 2008.

(51) Int. Cl.
*B43L 13/24* (2006.01)
*H01L 21/8242* (2006.01)

(52) U.S. Cl. .................. 33/19.2; 136/244; 438/244

(58) Field of Classification Search .......... 33/19.2; 136/244; 438/84; 257/E27.144
See application file for complete search history.

(56) References Cited

U.S. PATENT DOCUMENTS

| | | | |
|---|---|---|---|
| 4,502,225 A * | 3/1985 | Lin | ................. 33/18.1 |
| 4,996,108 A | 2/1991 | Divigalpitiya et al. | |
| 5,125,984 A | 6/1992 | Kruehler et al. | |
| 5,261,968 A | 11/1993 | Jordan | |
| 5,501,744 A | 3/1996 | Albright et al. | |
| 5,536,333 A | 7/1996 | Foote et al. | |
| 5,665,175 A | 9/1997 | Safir | |
| 5,855,974 A * | 1/1999 | Wu et al. | ................. 427/560 |
| 6,134,049 A * | 10/2000 | Spiller et al. | ................. 359/590 |
| 6,328,871 B1 | 12/2001 | Ding et al. | |
| 2005/0223570 A1* | 10/2005 | Yonezawa et al. | ............. 33/18.1 |
| 2006/0220059 A1 | 10/2006 | Satoh et al. | |
| 2007/0089782 A1 | 4/2007 | Scheuten et al. | |
| 2007/0151596 A1 | 7/2007 | Nasuno et al. | |
| 2007/0169810 A1 | 7/2007 | Van Duern et al. | |
| 2008/0041446 A1 | 2/2008 | Wu et al. | |
| 2008/0092945 A1 | 4/2008 | Munteanu et al. | |
| 2008/0092953 A1 | 4/2008 | Lee | |
| 2008/0216886 A1* | 9/2008 | Iwakura | ................. 136/244 |

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

(Continued)

*Primary Examiner* — William M. Brewster

(57) ABSTRACT

A method for forming one or more patterns for a thin film photovoltaic material. The method includes providing a substrate including a molybdenum layer and an overlying absorber comprising a copper bearing species and a window layer comprising a cadmium bearing species. The substrate is supported to expose a surface of the window layer. In a specific embodiment, the method includes using a scribe device. The scribe device includes a scribe having a tip. The scribe device is configured to pivot about one or more regions and configured to apply pressure to the tip, such that the tip is placed on a selected region of the window layer or the absorber layer. The method moves the scribe device relative to the substrate in a direction to form a pattern on at least the window layer or the absorber layer at a determined speed maintaining the molybdenum layer free from the pattern.

15 Claims, 4 Drawing Sheets

OTHER PUBLICATIONS

International Search Report & Written Opinion of PCT Application No. PCT/US 09/46161, date of mailing Jul. 27, 2009, 14 pages total.
International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

* cited by examiner

MECHANICAL PATTERNING OF THIN FILM PHOTOVOLTAIC MATERIALS AND STRUCTURE

CROSS-REFERENCES TO RELATED APPLICATIONS

This application claims priority to U.S. Provisional Application No. 61/106,506 filed Oct. 17, 2008, commonly assigned, and incorporated by reference in its entirety herein for all purposes

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates generally to photovoltaic materials and manufacturing method. More particularly, the present invention provides a method and structure for fabricating a thin film solar cells. Merely by way of example, the present method and structure include a patterned thin film stack layer for manufacture of copper indium gallium diselenide based thin film photovoltaic devices, but it would be recognized that the invention may have other configurations.

From the beginning of time, mankind has been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

BRIEF SUMMARY OF THE INVENTION

Embodiments according to the present invention relates to photovoltaic materials and manufacturing method. More particularly, the present invention provides a method and structure for fabricating a thin film solar cells. Merely by way of example, the present method and structure provides a patterned thin film stack layer for manufacture of copper indium gallium diselenide based thin film photovoltaic devices, but it would be recognized that the invention may have other configurations.

In a specific embodiment, a method for forming one or more patterns for a thin film photovoltaic material is provided. The method includes providing a substrate including a molybdenum layer and an overlying absorber layer and a window layer. In a specific embodiment, the overlying absorber comprises a copper bearing species and the window layer comprises a cadmium bearing species. The method supports the substrate to expose a surface of the window layer. In a specific embodiment, the method uses a scribe device including a scribe having a tip. In a specific embodiment, the scribe device is configured to pivot about one or more regions and to apply pressure to the tip, such that the tip is placed on a selected region of the window layer. The scribe device is allowed to pattern at least the window layer while stopping on the molybdenum layer at a determined speed in a specific embodiment. In a specific embodiment, the tip may form a slight pattern without causing an "open" in the molybdenum layer.

Many benefits can be achieved by applying the embodiments of the present invention. Particularly, the method provides a method for patterning a window layer together with an absorber layer to form a photovoltaic cell in a specific embodiment. Preferably, the present method provides a clean scribe region free of particles and contaminants on an underlying electrode layer, for example, a molybdenum layer. The resulting photovoltaic cell has a desirable contact resistance characteristics in a preferred embodiment. Additionally, the present method uses conventional process equipment without major modifications to provide for a cost effective way to fabricate a photovoltaic cell in a specific embodiment. Depending on the embodiment, one or more of these benefits may be achieved. Of course, there can be other variations, modifications, and alternatives.

DETAILED DESCRIPTION OF THE INVENTION

Embodiments according to the present invention relates to photovoltaic materials and manufacturing method. More particularly, the present invention provides a method and structure for fabricating a thin film solar cells. Merely by way of example, the present method and structure provide a patterned thin film stack layer for manufacture of copper indium gallium diselenide based thin film photovoltaic devices, but it would be recognized that the invention may have other configurations.

Figure 1:
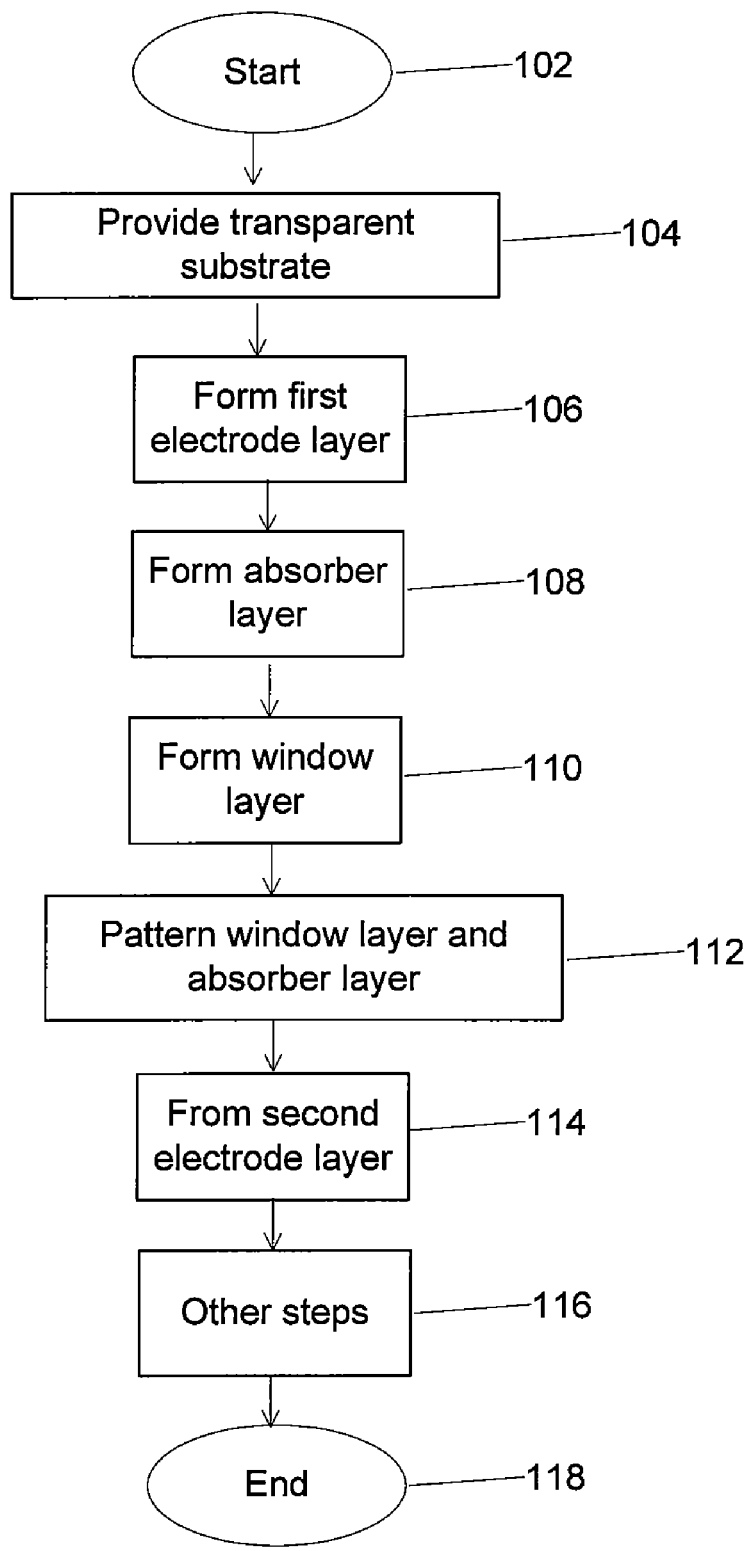
FIG. 1 is a simplified process flow diagram illustrating a method of fabricating a photovoltaic cell according to an embodiment of the present invention.

FIG. 1 is a simplified process flow diagram illustrating a method for fabricating a thin film photovoltaic cell according to an embodiment of the present invention. As shown the method begins with a Start step (Step 102). The method includes providing a transparent substrate (Step 104) having a first surface region. The transparent substrate can be a soda lime glass in a specific embodiment. A first electrode layer is formed overlying the first surface region of the transparent substrate (Step 106). The first electrode layer can be provided using a molybdenum material in a specific embodiment. Other electrode materials such as transparent conductive oxide material, other metal materials may also be used, depending on the application. The method includes forming an absorber layer overlying the first electrode layer (Step 108) and forming a window layer overlying the absorber layer (Step 110). In a specific embodiment, the window layer and the absorber layer is patterned using a scribe device (Step 112). A second electrode layer is formed overlying the window layer (Step 114). The method performs other steps to complete the photovoltaic device (Step 116). These other steps may include providing interconnect elements, ribbon elements, lamination, framing among others to complete the photovoltaic device. The method ends with an end step (Step 118). Of course there can be other variations, modifications, and alternatives.

The above sequence of steps provides a method of forming a photovoltaic device according to an embodiment of the present invention. As shown, the method includes a step of patterning an absorber layer and a window layer using a scribe device according to a specific embodiment. Depending on the embodiment, one or more steps may be added, one or more steps may be eliminated, and one or more steps may be performed in a different sequence without departing from the scope of the claims herein. One skilled in the art would recognize other variations, modifications, and alternatives.

Figure 2:
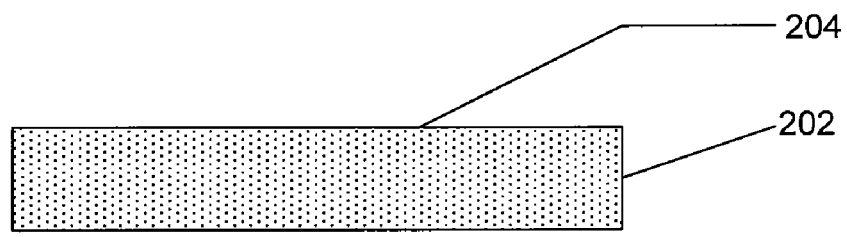
FIG. 2-7 are simplified diagrams illustrating a method of fabricating a photovoltaic cell according to an embodiment of the present invention.

FIGS. 2-6 are simplified diagrams illustrating a method of fabricating a photovoltaic cell according to an embodiment of the present invention. These diagrams are merely examples and should not unduly limit the claims herein. One skilled in the art would recognize other variations, modifications, and alternatives. As shown in FIG. 2, a transparent substrate member 202 including a surface region 204 is provided. The substrate member can be a glass material such as soda lime glass in certain embodiment. Soda lime glass is a cost effective option for the transparent substrate member. Other suitable transparent substrates such as quartz, fused silica, solar glass can also be used. Each of the transparent substrate can include a barrier layer deposited on a surface region. The barrier layer prevents sodium ions from the glass material to diffuse into photovoltaic material area in a specific embodiment. The barrier layer can be a dielectric material such as silicon oxide deposited using technique such as a sputtering process, a chemical vapor deposition process, including plasma enhanced processes, and others. Other barrier materials may also be used. These barrier materials include aluminum oxide, titanium nitride, silicon nitride, tantalum oxide, zirconium oxide depending on the embodiment.

Figure 3:
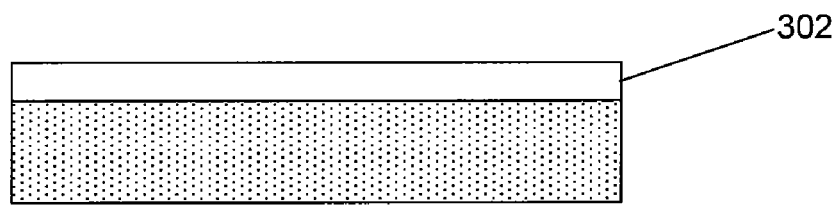

Referring to FIG. 3, the method includes forming a first electrode layer 302 overlying the surface region of the transparent substrate member which can have a barrier layer formed thereon. The first electrode layer may be provided using a transparent conductor oxide (TCO) such as indium tin oxide (commonly called ITO), fluorine doped tin oxide, and the like. In certain embodiments, the first electrode layer may be provided using a metal material. The metal material can be a molybdenum material in a specific embodiment. The molybdenum material can be formed using deposition techniques such as sputtering, plating, physical vapor deposition (including evaporation, sublimation), chemical vapor deposition (including plasma enhanced processes) following by a patterning process. Molybdenum material provides certain advantage over other electrode material for a CIG or CIGS based thin film photovoltaic cells. For example, molybdenum material provides a low contact resistance for CIGS film and stability over subsequent process steps. In a specific embodiment, molybdenum material is formed by depositing a first molybdenum layer overlying the transparent substrate member. The first molybdenum layer has a first thickness and a tensile characteristics in a specific embodiment. A second molybdenum layer having a compression characteristics and a second thickness is formed overlying the first molybdenum layer. In a specific embodiment, the first electrode layer comprising the molybdenum material can be further patterned as shown. Further details of deposition and patterning of the molybdenum material can be found at least in U.S. Provision Application No. 61/101,646 filed Sep. 30, 2008 and U.S. Provision Application No. 61/101,650 filed Sep. 30, 2008, commonly assigned, and hereby incorporate by reference. Of course, there can be other variations, modifications, and alternatives.

Figure 4:
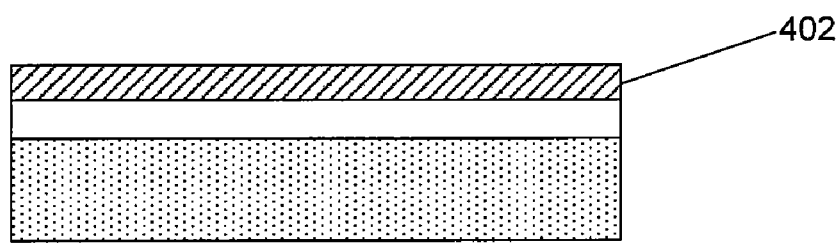
Figure 5:
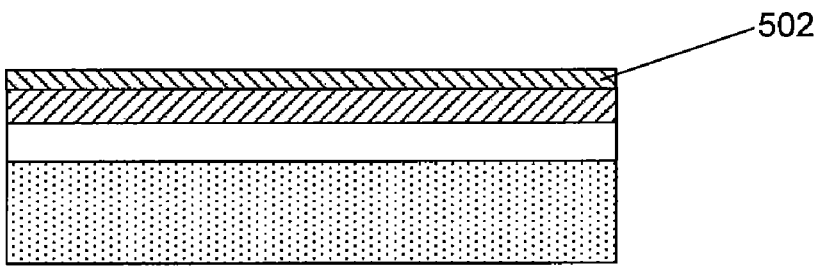

As shown in FIG. 4, the method includes forming an absorber layer 402 overlying a surface region of the first electrode layer. The absorber layer can be a thin film semiconductor material in a specific embodiment. In a specific embodiment, the thin film semiconductor material is a p-type semiconductor material provided by a copper indium disulfide material, or a copper indium gallium disulfide material, or a copper indium diselenide material, or a copper indium gallium diselenide material, any combination of these, or others, depending on the application. Typically, the p-type characteristics may be provided using dopants such as boron or aluminum species. The absorber layer may be deposited by techniques such as sputtering, plating, evaporation including a sulfurization or selenization step. Further details of the formation of the absorber material may be found in Provisional U.S. Patent Application No. 61/059,253, titled "High Efficiency Photovoltaic Cell and Manufacturing Method," commonly assigned, and hereby incorporated by reference.

In a specific embodiment, the method forms a window layer 502 overlying a surface region of the absorber layer to form a photovoltaic film stack to provide for a pn junction for the photovoltaic cell. The window layer is often provided using a wide bandgap n-type semiconductor material for a p-type absorber layer in a specific embodiment. In a preferred embodiment, the window layer uses a cadmium sulfide material for a photovoltaic cell using CIGS, CIS and related materials as absorber layer. The window layer can be deposited using techniques such as sputtering, vacuum evaporation, chemical bath deposition, among others.

Figure 6:
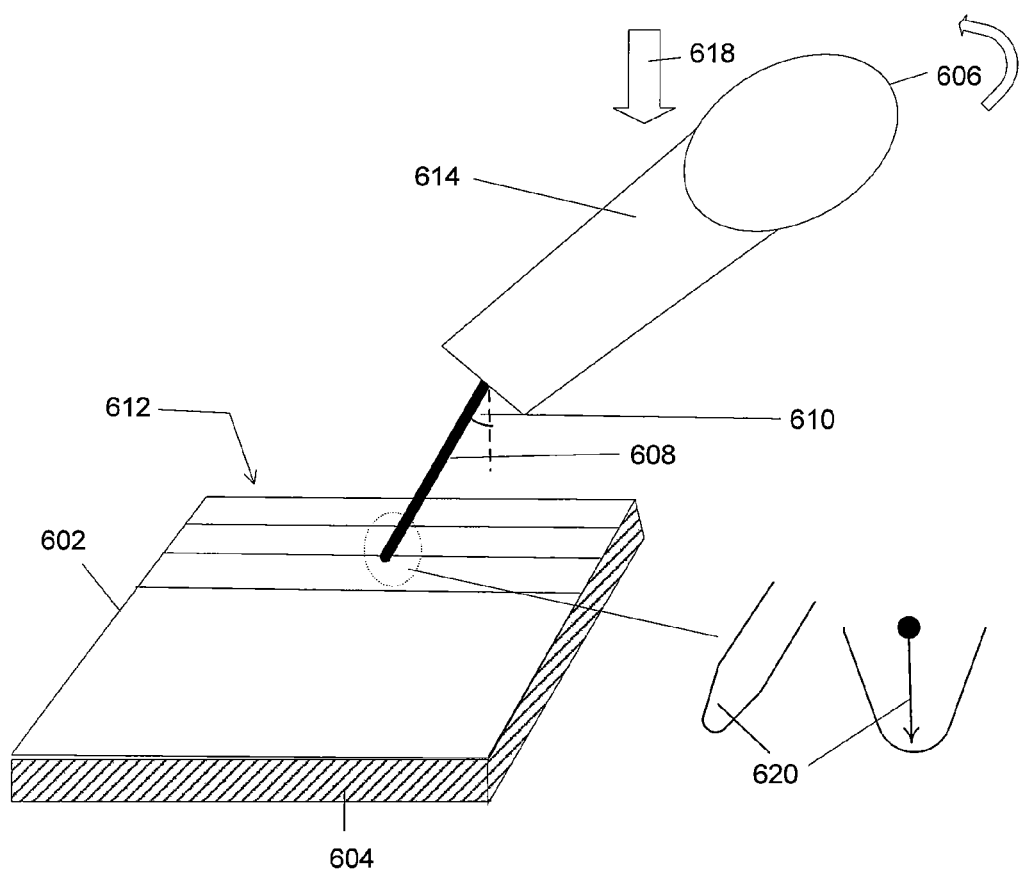

In a specific embodiment, the method includes patterning the absorber layer and the window layer as shown in FIG. 6. As shown, a substrate 602 is provided. The substrate includes a molybdenum layer overlying a transparent substrate and an overlying absorber layer. The absorber layer comprises a CIGS thin film material in a specific embodiment. A window layer comprising a cadmium sulfide overlies the absorber layer to provide for a photovoltaic stack material. As shown, the substrate is provided on a supporting tray or a rack 604, exposing the window layer. The photovoltaic stack material is characterized by a brittle nature and molybdenum is a relatively hard metal. As shown, the method includes providing a scribe device 606. In a specific embodiment, the tip can be made of material such as diamond, tungsten carbide, or silicon carbide, and the like. Other materials having sufficient hardness may also be used for the tip depending on the application. In a specific embodiment, the tip is characterized by a radius 620 ranging from about 20 microns to about 40 microns and preferably 25 microns and more. The scribe device includes a scribe head 614 which can be a pivot device in a specific embodiment. In a specific embodiment, the scribe device is configured to pivot about one or more regions on the scribe head. As shown, the scribe device includes a pressure device 618 to dial in a force to maintain the tip on the surface of the window layer while the scribe device moves along the surface of the window layer. The pressure device can be a pressure-spring, a weight, or the like in a specific embodiment. In certain embodiment, the tip is configured to be at an angle 610 to a normal to a surface region 612 of the window layer. The angle can be ranging from about zero degrees to about 40 degrees and preferably between 10 degrees and 20 degrees depending on the embodiment. In a specific embodiment, the tip is configured to be at an angle of about 15 degrees to the normal to the surface. Of course there can be other variations, modifications, and alternatives.

Figure 7:
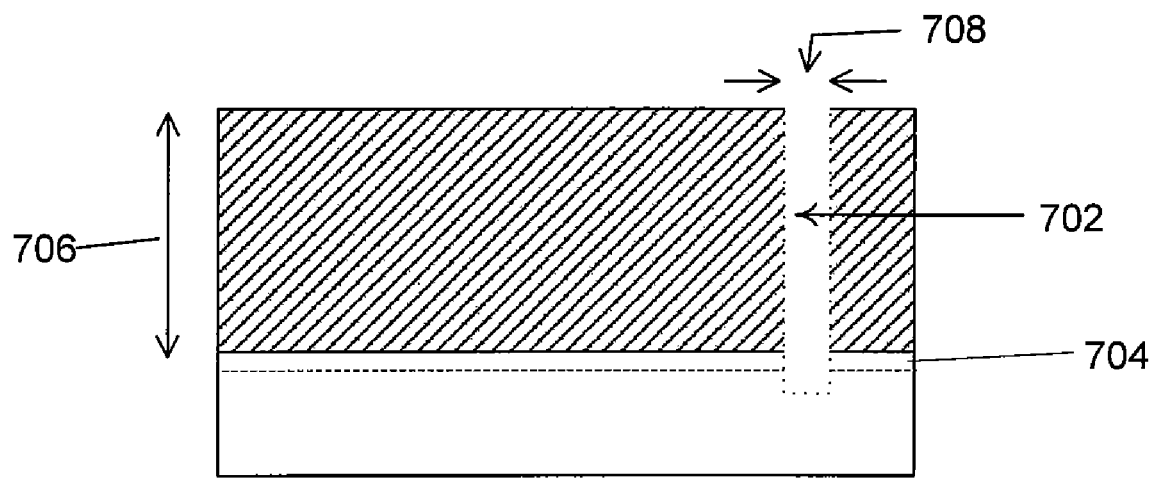

In a specific embodiment, the method includes allowing the scribe device to move over a selected region in one or more passes to remove the photovoltaic stack material from the selected region to form a scribe region. The scribe device substantially stops at the underlying molybdenum surface. A simplified cross sectional diagram illustrating a scribe region 702 provided by the scribe device is shown in FIG. 7. In a specific embodiment, the molybdenum layer includes an interface layer 704 formed from the absorber layer material and the molybdenum material. In a specific embodiment, the interface layer comprises a graded material characterized by a $MoSe_x$, species or a $MoS_y$ species depending on the absorber material used. The graded material can have a thickness of about 100 Angstroms in a specific embodiment. As shown, the scribe region extends through a thickness 706 of the photovoltaic material stack and the interface layer forming a recess region of no greater than 200 Angstroms in the molybdenum layer in a preferred embodiment. In a specific embodiment, the selected region allows the photovoltaic stack material to be aligned with underlying molybdenum layer, which has been patterned. The selected region forms a pattern having a width 708 ranging from about 30 microns to about 100 microns in a specific embodiment. In a specific embodiment, the pattern can have a width of about 50 microns. Additionally, the one or more passes allows the scribe region to be substantially cleaned and free of contaminants and particles thus providing a lower contact resistivity and good ohmic contact to interconnects for the photovoltaic cell in a specific embodiment. Further, the scribe region separates a first photovoltaic region from a second photovoltaic region without shorting in a preferred embodiment. In a specific embodiment, the scribe device moves at a predetermined optimized speed at about 0.25 meter per second and greater, or may be slightly less. Of course there can be other variations, modifications, and alternatives.

In a specific embodiment, the method performs other steps to complete the photovoltaic cell. These other steps can include forming a second electrode layer overlying the window layer, sealing the photovoltaic cell, framing, among others. In a specific embodiment, the second electrode layer can be a transparent conductive oxide such as indium tin oxide (commonly called ITO), fluorine doped tin oxide, and the like. The second electrode layer can be deposited using techniques such as sputtering, physical vapor deposition, solution based deposition, and others. Of course there can be other variations, modifications, and alternatives.

While the present invention has been described using specific embodiments, it should be understood that various changes, modifications, and variations to the method utilized in the present invention may be effected without departing from the spirit and scope of the present invention as defined in the appended claims. Additionally, although the above has been generally described in terms of a specific structure for CIS and/or CIGS thin film cells, other specific CIS and/or CIGS configurations can also be used, such as those noted in U.S. Pat. No. 4,612,411 and U.S. Pat. No. 4,611,091, which are hereby incorporated by reference herein, without departing from the invention described by the claims herein. Additionally, the present invention can be applied to other photovoltaic materials and configurations. Examples of these other thin film photovoltaic materials may include metal chalcogenide materials. Such metal chalcogenide materials can include metal oxides (for example, ZnO, FeO, $Fe_2O_3$, CuO, $Cu_2O$), metal sulfides (for example, iron sulfide, copper sulfide) metal selenides (for example, zinc selenide), and others. Depending on the embodiment, the present method can also be applied to silicon based photovoltaic devices. Of course, one of ordinary skill in the art would recognize other variations, modifications and alternatives.

What is claimed is:

1. A method of forming patterns on a thin film photovoltaic structure comprising:

providing a soda lime glass substrate having a first molybdenum layer and a second molybdenum layer overlying the first molybdenum layer, the first molybdenum layer being tensile stress and the second molybdenum layer being in compressive stress to suppress formation of voids in the molybdenum layers;

forming the absorber layer which includes copper over the second molybdenum layer;

at the time the absorber layer is formed, also forming an interface layer between the second molybdenum layer and the absorber layer, the interface layer including a graded composition of a combination of molybdenum and material from an absorber layer, and having a thickness of at least about 100 Angstroms;

depositing a window layer including cadmium disposed over the absorber layer;

supporting the substrate with the window layer exposed;

applying a scribe device having a tip with pressure against the window layer; and moving the scribe device at about 0.25 meter per second relative to the substrate to form a scribe region pattern between about 30 and 100 microns in width on at least the window layer while maintaining the molybdenum layer free from the pattern of the scribe device.

2. The method of claim 1 wherein the overlying absorber comprises copper indium gallium diselenide.

3. The method of claim 1 wherein the overlying absorber comprises copper indium diselenide.

4. The method of claim 1 wherein the window layer comprises a cadmium sulfide material.

5. The method of claim 1 wherein the scribe device uses a pressure-spring to apply pressure to the tip.

6. The method of claim 5 wherein the tip is provided at an angle ranging from about normal to about 15 Degrees relative to the normal from the surface of the window layer.

7. The method of claim 6 wherein the scribe device is pivoted to maintain a constant force between the tip and the window layer.

8. The method of claim 1 wherein the step of moving the scribe device is performed for multiple passes to form a recessed region of no greater than 200 Angstroms in the second molybdenum layer.

9. The method of claim 8 wherein the tip has a radius of at least 25 microns.

10. The method of claim 8 wherein the tip has a radius ranging from about 20 microns to about 50 microns.

11. The method of claim 8 wherein the tip comprises a silicon carbide material.

12. The method of claim 8 wherein the tip comprises a diamond material.

13. The method of claim 8 wherein the tip comprises a tungsten carbide material.

14. The method of claim 1 wherein the pattern has a width of about 50 microns.

15. The method of claim 1 wherein the pattern separates a first region of the absorber layer from a second region of the absorber layer without dividing the second molybdenum layer.

* * * * *